(12) United States Patent
Chiriku et al.

(10) Patent No.: US 7,351,911 B2
(45) Date of Patent: Apr. 1, 2008

(54) CONNECTION BOX

(75) Inventors: Akihiko Chiriku, Shizuoka-ken (JP);
Norio Ito, Shizuoka-ken (JP); Hiroyuki Sasaki, Shizuoka-ken (JP); Hiroyuki Kondo, Shizuoka-ken (JP); Shinichi Furui, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 203 days.

(21) Appl. No.: 10/132,264

(22) Filed: Apr. 26, 2002

(65) Prior Publication Data

US 2002/0170732 A1    Nov. 21, 2002

(30) Foreign Application Priority Data

Apr. 27, 2001    (JP)    ............................ 2001-133531

(51) Int. Cl.
*H02G 3/18*    (2006.01)
(52) U.S. Cl. ........................... 174/59; 174/60; 361/683; 361/406; 439/76.2

(58) Field of Classification Search .................. 174/59, 174/60; 361/683, 406, 395, 826, 728–730, 361/715, 720; 439/76.2
See application file for complete search history.

(56) References Cited

U.S. PATENT DOCUMENTS

| | | | | |
|---|---|---|---|---|
| 5,023,752 A | * | 6/1991 | Detter et al. ................. | 361/752 |
| 5,703,757 A | * | 12/1997 | Hayes et al. ................. | 361/752 |
| 5,724,233 A | * | 3/1998 | Honda et al. ................ | 361/813 |
| 6,116,916 A | * | 9/2000 | Kasai ......................... | 439/76.2 |
| 6,560,115 B1 | * | 5/2003 | Wakabayashi et al. ...... | 361/728 |

* cited by examiner

*Primary Examiner*—Dhiru R. Patel
(74) *Attorney, Agent, or Firm*—Finnegan, Henderson, Farabow, Garrett & Dunner, L.L.P.

(57) ABSTRACT

An connection box includes a circuit board. The box includes a control board connected to the circuit board. The control board includes an insulation board. The box includes a radiative device mounted on the control board. The radiative device is spaced away from the insulation board. The radiative device includes a wire extending therefrom above the insulation board.

15 Claims, 12 Drawing Sheets

CONNECTION BOX

BACKGROUND OF THE INVENTION

The present invention relates to a connection box which collectively connects and distributes wire-harness in the case that wire harness is arranged in a vehicle.

The connection box is substantially formed by piling a single-layered or a multi-layered circuit board in which bus bar and electric wires are arranged so as to constitute a desired circuit, on a plane wiring board, and by covering the board by an upper cover and an under cover. A control boardboard constituting an electronic control portion is mounted on the board mentioned above. The control base boardboard has an insulating board, and electronic parts such as a resistor, a coil, a relay, a fuse and the like are provided thereon. The control base board is connected to a predetermined circuit of the board.

The relay provided on the control base board could employ a mechanical type using an electromagnetic solenoid in order to be capable of accommodating to a comparatively large electric current. The mechanical relay has an electromagnetic solenoid to produce a large amount of heat.

SUMMARY OF THE INVENTION

However, in the connection box mentioned above, the relay is generally mounted to the insulating board in the same closely contact manner as that of the other electronic parts. Accordingly, heat to be produced by the relay has a great influence on the insulating board. This heat gives an influence onto the other electronic parts so as to cause a false function.

Accordingly, the present invention provides a connection box, which effectively reduces the influence of produced heat of a relay against another electronic part by a simple structure of changing a mounting state of the relay, thereby improving a reliability.

The aspect of the invention provides a connection box. The box includes a circuit board. The box includes a control board connected to the circuit board. The control board includes an insulation board. The box includes a radiative device mounted on the control board. The radiative device is spaced away from the insulation board.

Preferably, the radiative device includes a wire extending therefrom above the insulation board.

Preferably, the radiative device includes a relay.

According to the invention, the radiative device and the insulation board have an air layer with a spacing between them. The air layer works as a heat insulation layer to insulate the heat produced from the radiative device. This insulation reduces the heating of the insulation board. This results in restricting of heat influence applied to the other electronic parts mounted to the insulation board.

The wire exposes from the radiative device, and a part of the heat produces in the radiative device is conducted to the wire. The radiating of heat at an exposure portion allows the radiative device to be cooled.

BRIEF DESCRIPTION OF THE ACCOMPANYING DRAWINGS

DETAILED DESCRIPTION OF THE PREFERRED EMBODIMENTS

A description will be in detail given below of an embodiment according to the present invention with reference to the accompanying drawings.

Figure 1:
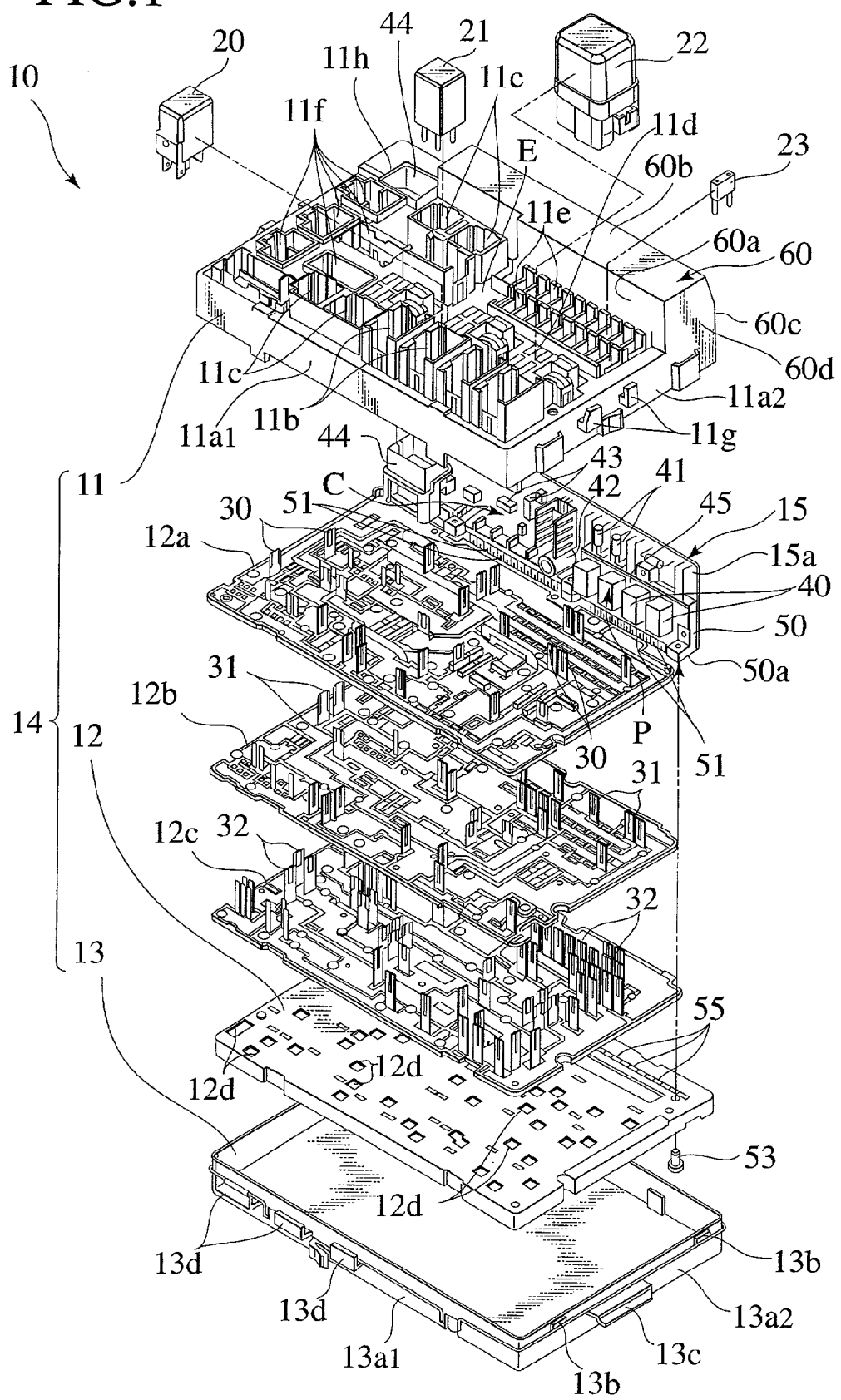
FIG. 1 is an exploded perspective view of a module.
Figure 2:
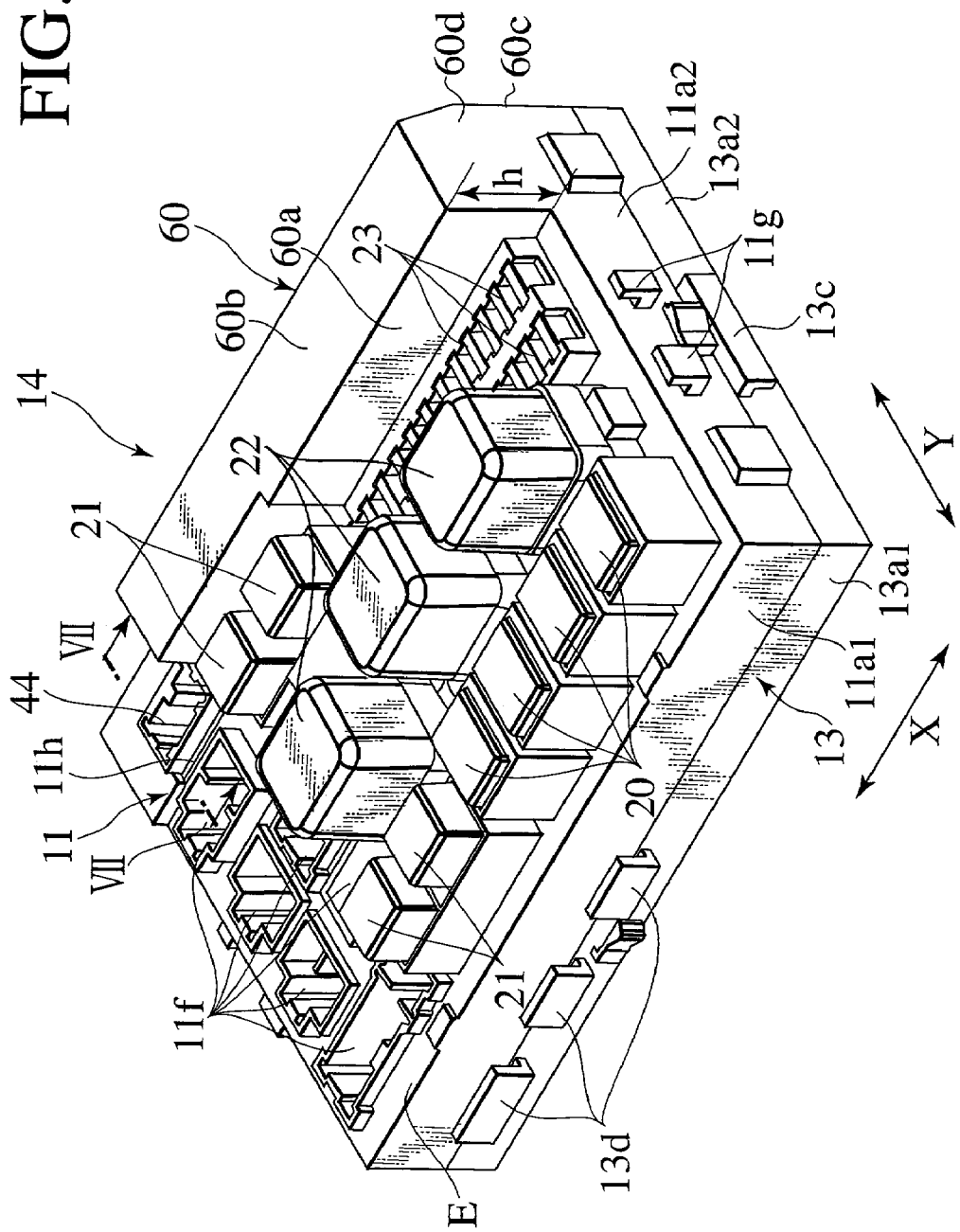
FIG. 2 is a perspective view of the module.

A connection box 10 has a plane wiring board 12 in which multi-layered circuit boards 12a, 12b and 12c are piled, as shown in FIG. 1. A control base board 15 is mounted on the board 12. The base board 15 is received between an upper cover 11 and an under cover 13. They constitute a module 14 as shown in FIG. 2. The module 14 is received within a case 18 constituted by an upper case 16 and a lower case 17.

Side walls 11a1 and 11a2 around the upper cover 11 are removably fitted to outer surfaces of upper end portions in side walls 13a1 and 13a2 around the under cover 13 via a lock hook 13b. The cover 11 receives the board and the base board 15 in an inner side thereof.

Figure 3:
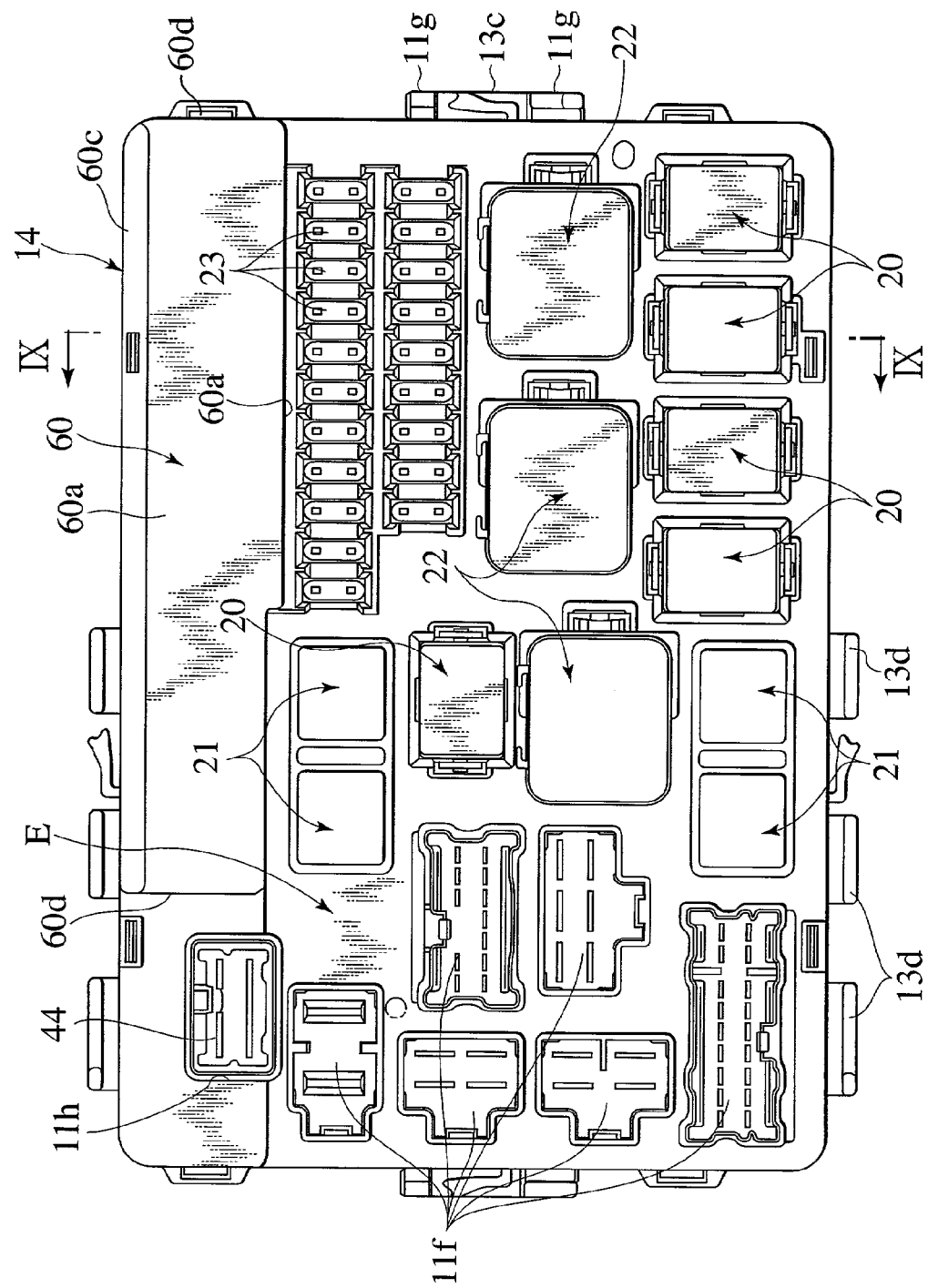
FIG. 3 is a plan view of the module.

The upper surface (on the drawing) of the upper cover 11 forms a mounting face E, and various kinds of relays such as a micro relay 20, a half micro relay 21, a 2M relay 22 and the like which are outward attached, and outward attached electronic parts such as a fuse and the like are mounted thereto, as shown in FIGS. 1, 2 and 3. This mounting face E has insertion openings 11b, 11c and 11d for the various kinds of relays. The mounting face E has an insertion opening 11e for the fuse 23.

One side (a left end portion in FIG. 3) of the upper cover 3 is provided with a plurality of connectors 11f for removably inserting mating connectors (not shown) in a combined manner.

Further, as shown in FIG. 2, the upper cover 11 and the under cover 13 have both side walls 11a2 and 13a2 in a Y direction. First pressing lock pieces 11g and 13c having an L-shaped cross section are integrally protruded from the side walls 11a2 and 13a2 respectively. Second pressing lock pieces 13d having an L-shaped cross section are integrally protruded from both side walls 11a1 and 13a1 in an X direction orthogonal to the side walls 11a2 and 13a2.

The plane wiring board 12 is formed by a rectangular reverse-dish-shaped hard resin board as shown in FIG. 1, and is formed together with a lot of wiring holes 12d. The board 12 has three plied circuit boards 12a, 12b and 12c thereon. The board 12 has a plurality of arranged electric wires 56 on a back surface thereof.

The respective circuit boards 12a, 12b and 12c have bus bars respectively arranged thereon, and the bus bars constitute a desired circuit. The bus bars respectively have terminal portions 30, 31 and 32, and they are stood upward from predetermined positions. Each of the respective circuit boards 12a, 12b and 12c has an insulation displacing terminal 57, which is integrally formed with the bus bar and is stood downward from a predetermined position.

Figure 8:
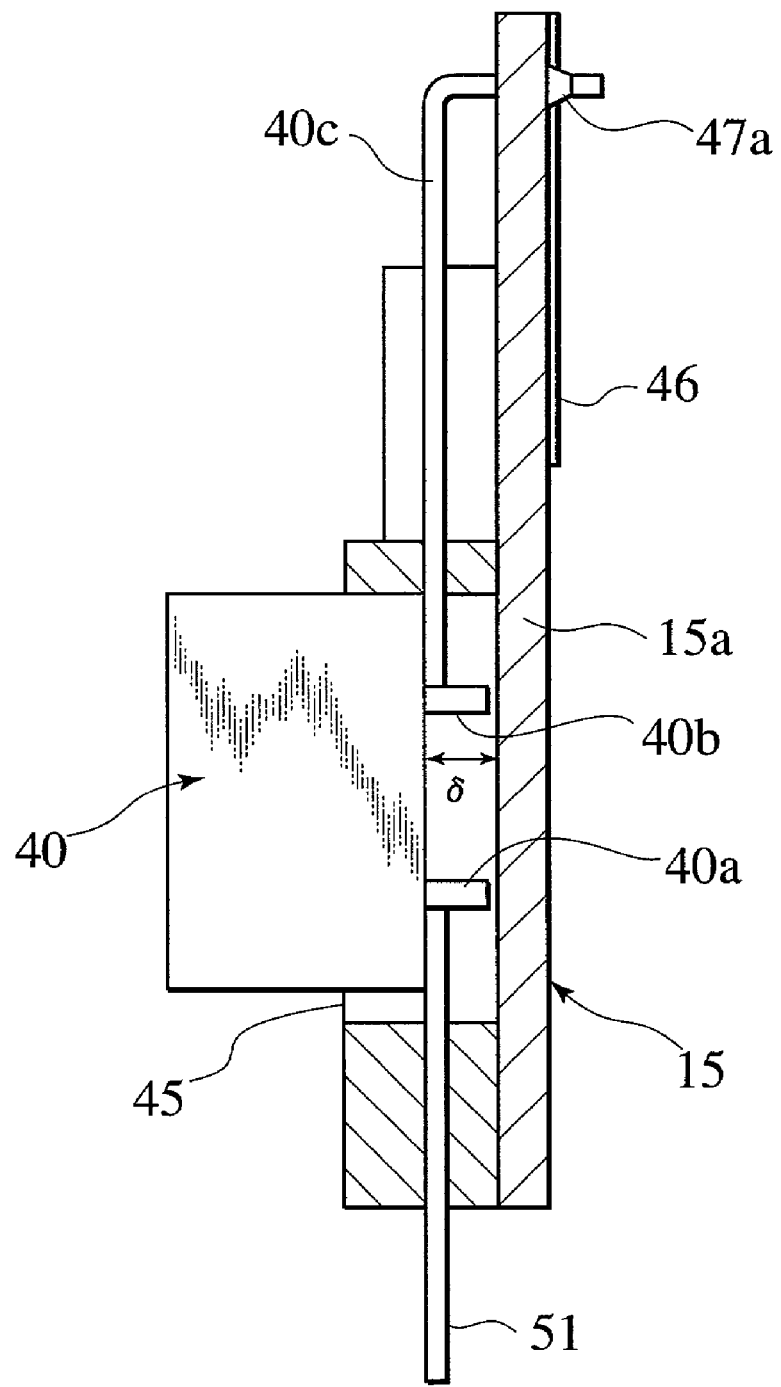
FIG. 8 is an enlarged sectional view of a main portion taken along a line of VIII-VIII in FIG. 5.

The respective circuit boards 12a, 12b and 12c are stacked with each other. The lower circuit board 12c has a terminal 32, which passes through the upper circuit boards 12a and 12b so as to protrude above of the upper circuit board 12a. The middle circuit board 12b has a terminal 31, which passes through the upper circuit board 12 so as to protrude out. The insulation displacing terminals 57 of the respective circuit boards 12a, 12b and 12c are taken out to the back surface of the board 12 from the wiring holes 12d, and are press contacted to electric wires 56 so as to be connected as shown in FIG. 8. Accordingly, the board 12 has a desired circuit constituted by the respective circuit boards 12a, 12b and 12c and the electric wires 56.

Figure 4:
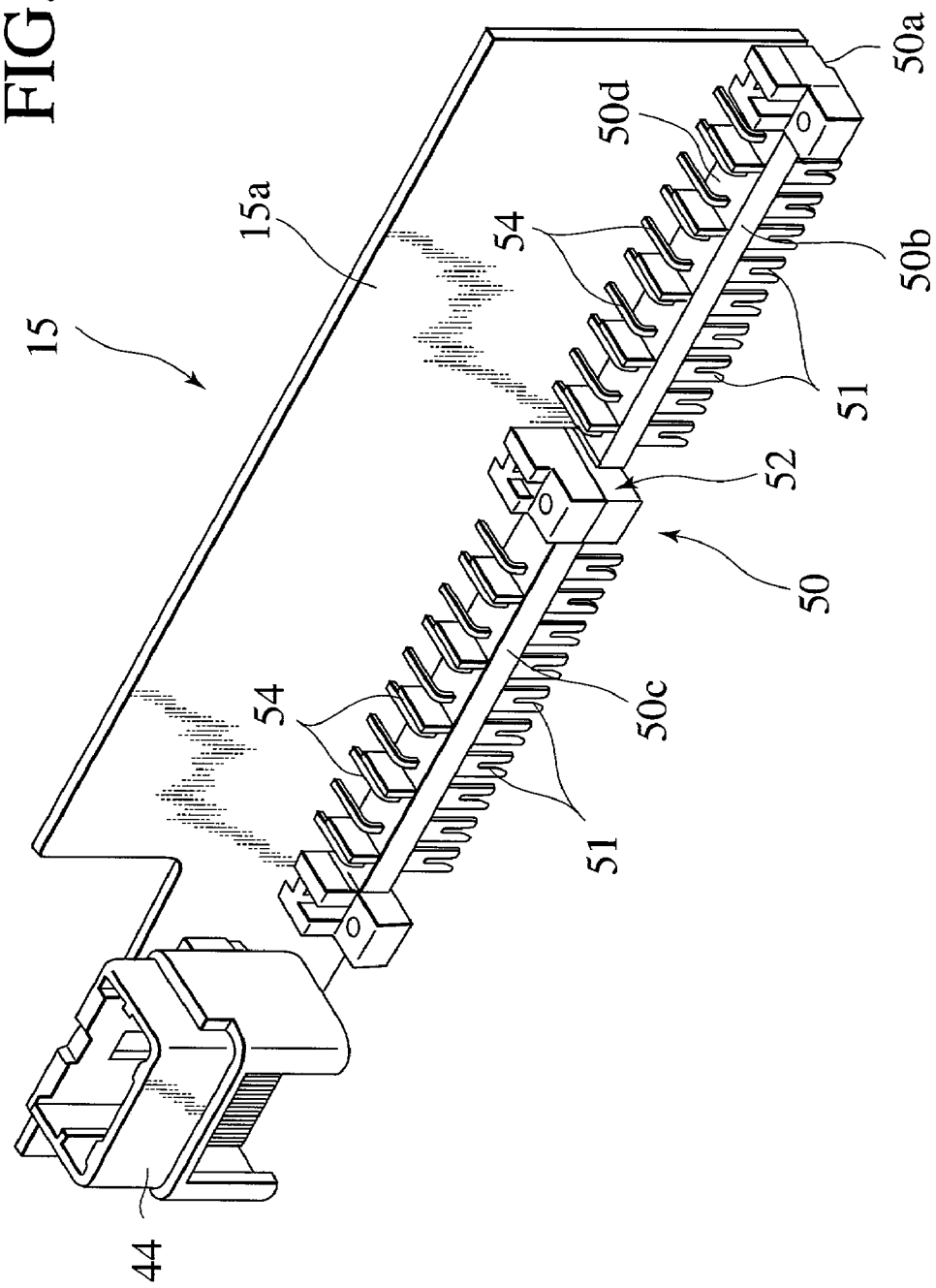
FIG. 4 is an enlarged perspective view of a basic structure from which various kinds of electronic parts of a control base board have been removed.

The control base board 15 has an insulation board 15a, and various kinds of electronic parts, for example, a relay 40, a resistor 41, a coil 42 and a control device 43 are mounted thereto. The base board has a connector 44 at an end portion in a longitudinal direction thereof. The control base board 15 is arranged in a standing state. A terminal block 50 is mounted in a substantially perpendicular direction to a front surface (in a near side in the drawing) of a lower end portion in the base board 15, as shown in FIG. 4. A desired number of insulation displacing terminals 51 connected to a predetermined circuit of the base board 15 protrude from a vertical outer surface 50a (a lower surface in the drawing) of the terminal block 50.

Figure 5:
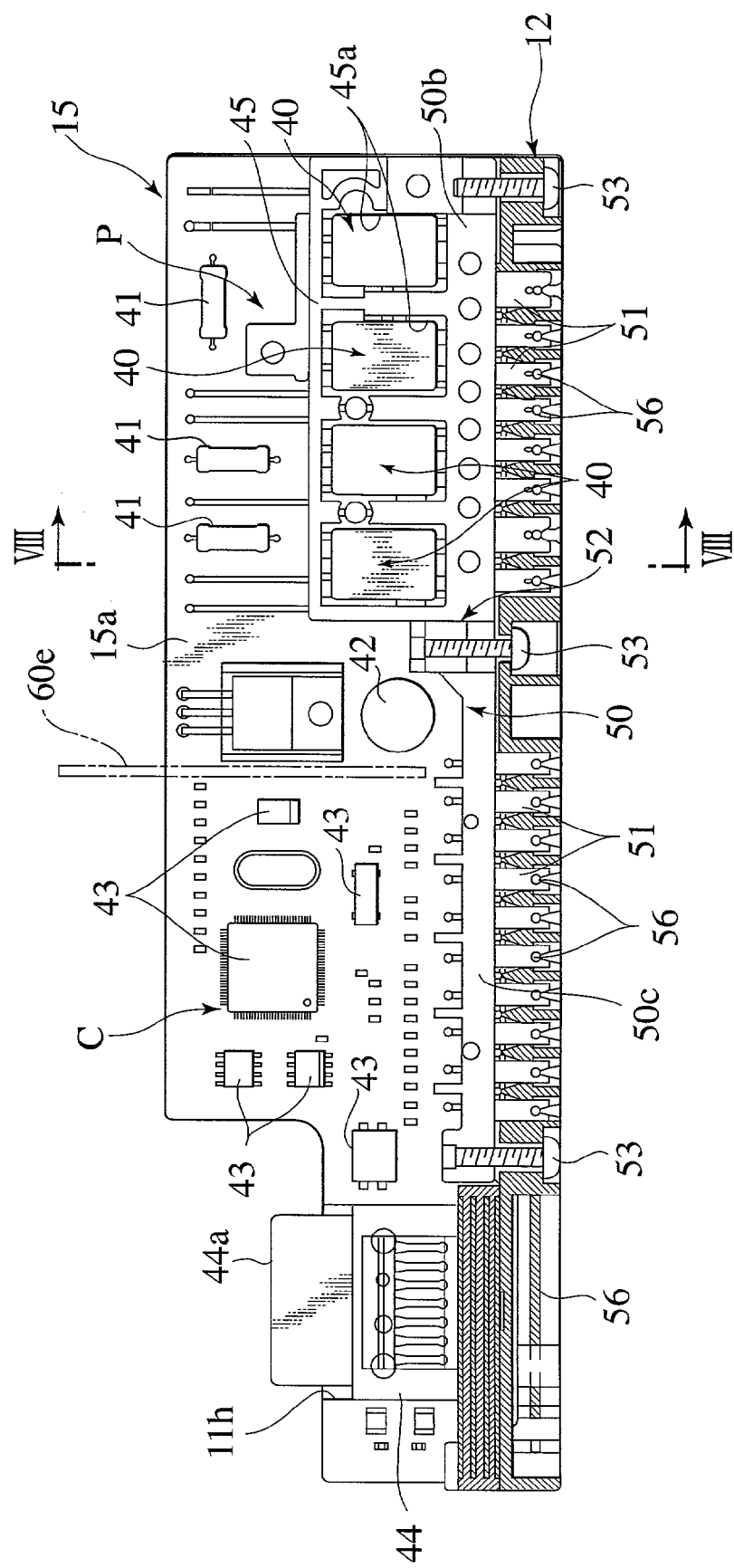
FIG. 5 is a plan view showing a cross section of a compression bonded portion of a compression bonded terminal in which the control base board has been mounted to a plane wiring board.

The electronic parts have a power portion P constituted by the relay 40, the resistor 41 and the coil 42. The electronic parts have a control portion C constituted by a device (for example, a microprocessor, ROM or RAM) 43. As shown in FIG. 5, the power portion P having a large amount of generation heat is arranged in a half side (in a near side in FIG. 1) in a longitudinal direction of the insulation board 15a together. The control portion C having a small amount of generation heat is arranged in another half side (in a far side in FIG. 1) in the longitudinal direction of the insulation board 15a together.

Figure 10:
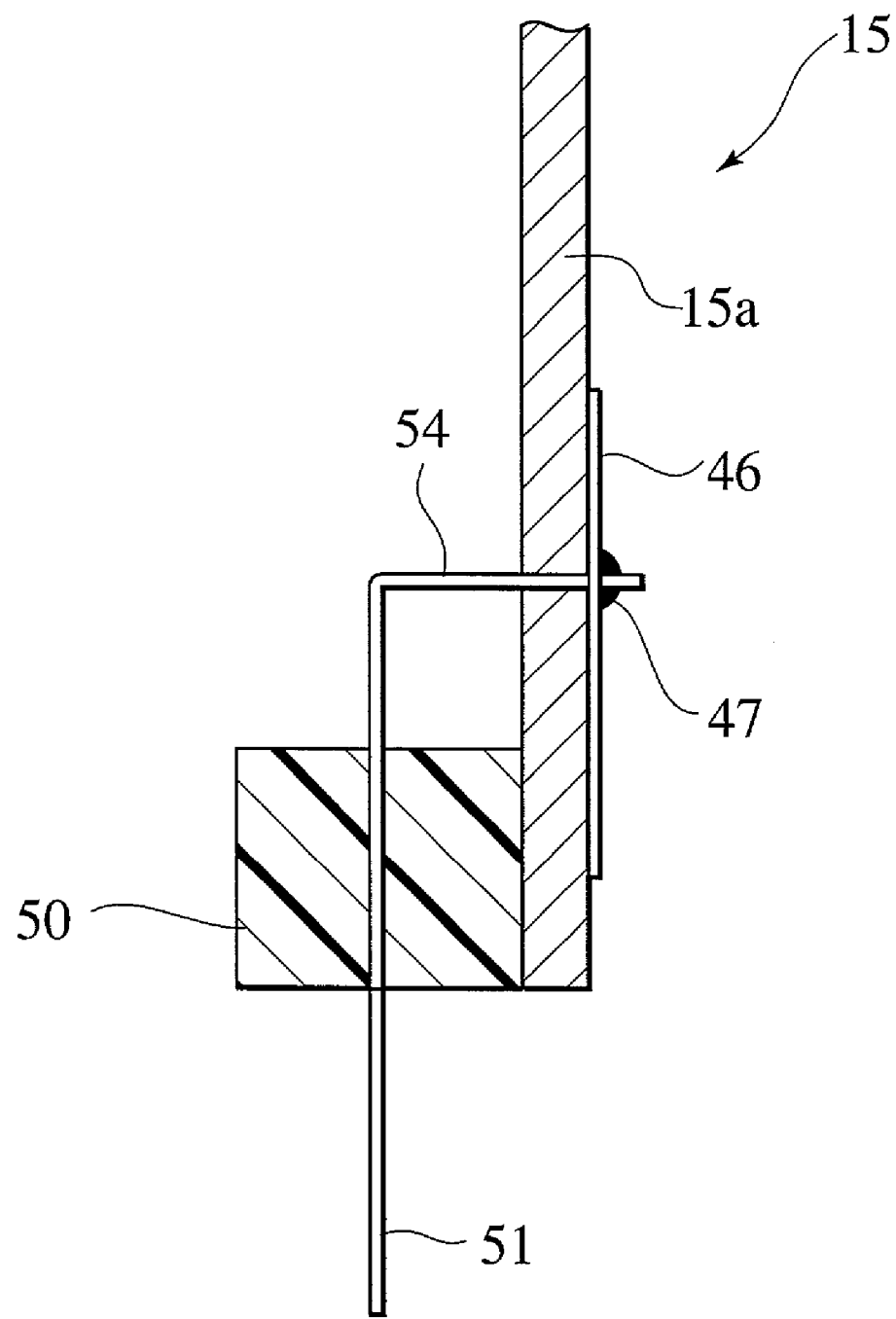
FIG. 10 is a sectional view of a main portion showing a connection structure between the insulation displacing terminal and a circuit pattern in the control base board.
Figure 11:
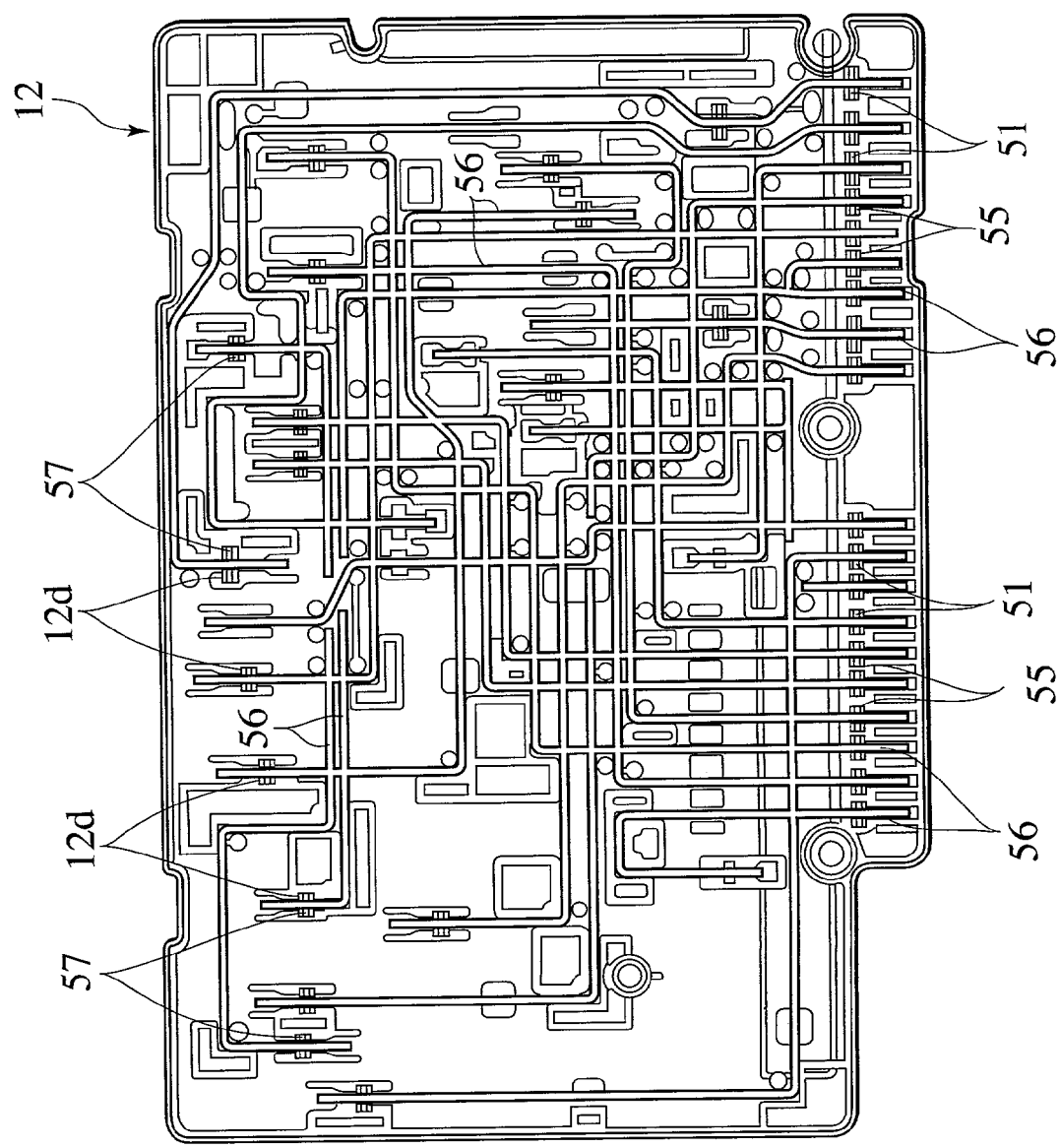
FIG. 11 is a schematic view of electric wires arranged on the plane wiring board.

The relay 40, the resistor 41 and the coil 42 in the power portion P, and the device 43 in the control portion C are connected by a narrow circuit pattern 46 (refer to FIG. 10). The circuit pattern 46 is structured such that a conductor is printed on the insulation board 15a. A width of the print determines whether the circuit pattern 46 is thick or narrow.

Figure 6:
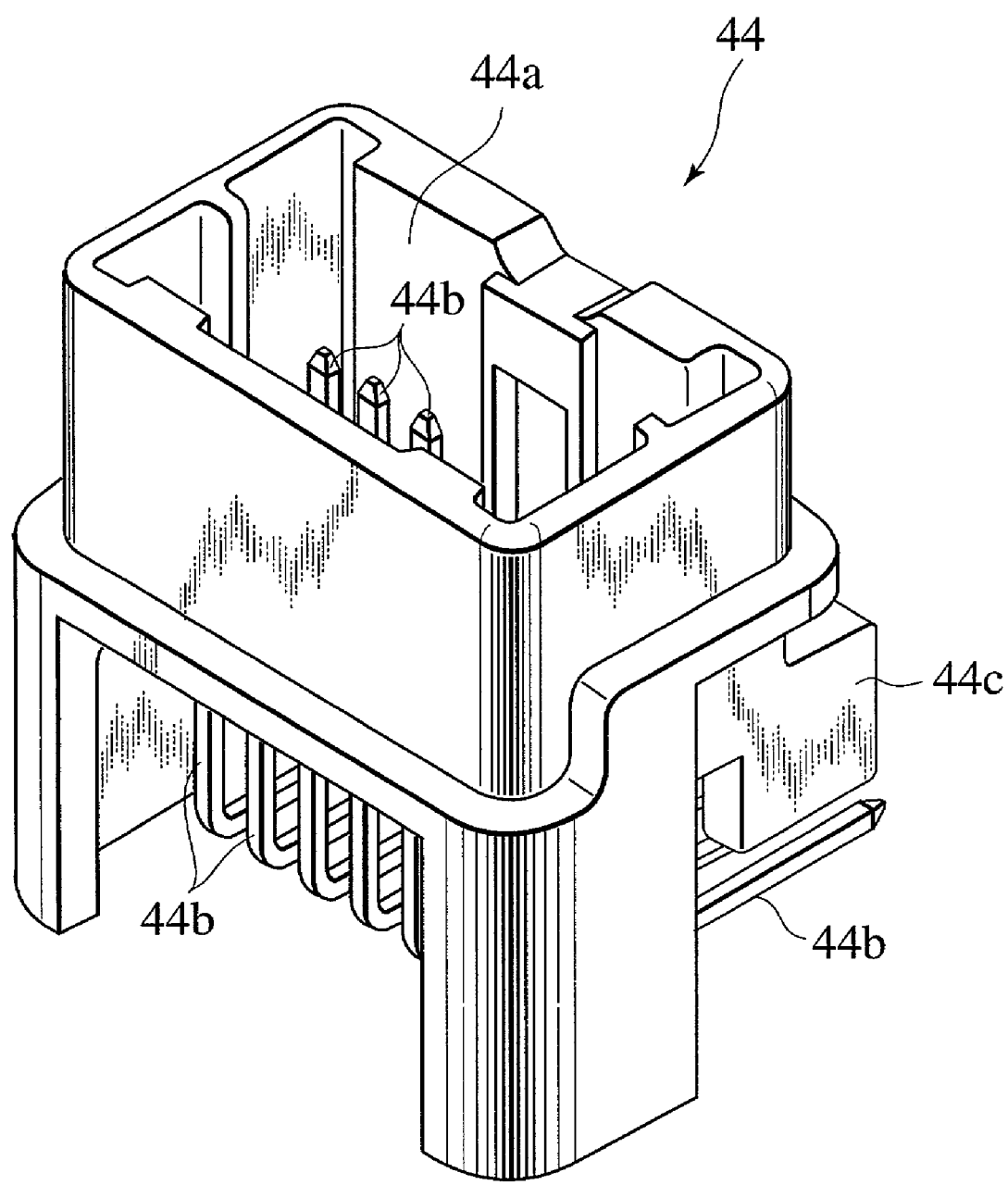
FIG. 6 is an enlarged perspective view of a base board connector.

The connector 44 is independently provided from the base board 15, as shown in FIG. 6. The mating connector (not shown) is inserted to an insertion opening 44a thereof. The end of each of a plurality of terminals 44b protrudes within the insertion opening 44a. This one end is connected to the mating connector. Another end of each of these terminals 44b protrudes to an outer portion corresponding to a lower side in the drawing of the insertion opening 44a. A front end of another end is bent perpendicular to the base board 15.

Figure 7:
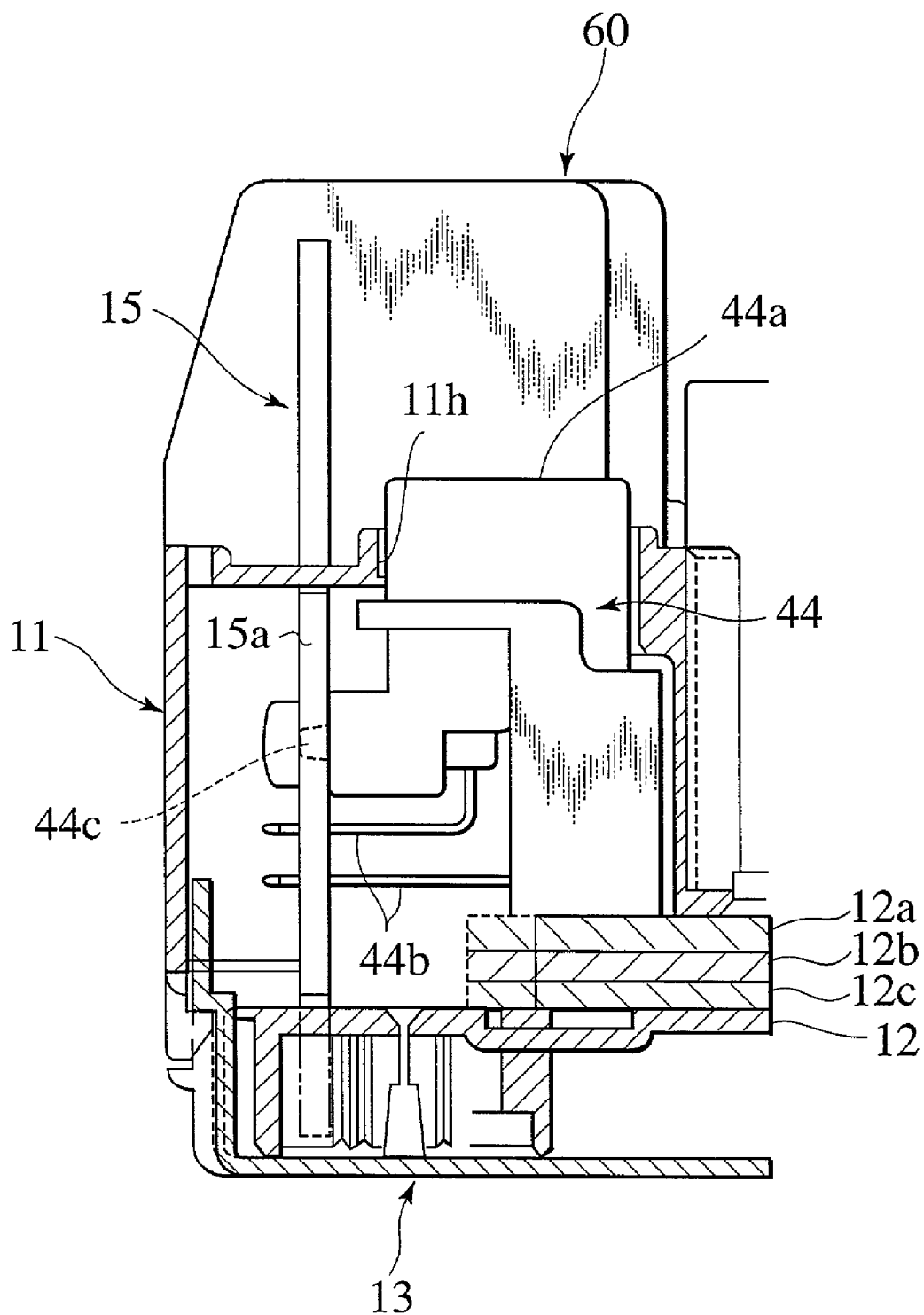
FIG. 7 is an enlarged sectional view of a main portion taken along a line of VII-VII in FIG. 2.

The connector 44 has a projection 44c on a rear side, as shown in FIG. 7. The projection 44c is pressed into a fitting hole (not shown) formed in the insulation board 15a of the base board 15. According to this pressing, the front end of the terminal 44b is inserted to the control base board 15 and is connected to a predetermined circuit pattern. At this time, the insertion opening 44a of the connector 44 is faced outward from an opening 11h formed in the upper cover 11.

The relay 40 employs a mechanical type using an electromagnetic solenoid. The relay is structured such as to be turned on and off by the electromagnetic solenoid. This structure increases generation heat of the solenoid. Accordingly, the relay 40 is supported to a relay holding board 45 mentioned below, as shown in FIG. 8. The relay is mounted by a predetermined spacing δ apart from the insulation board 15a of the base board 15.

The relay 40 has power terminals 40a and 40b, and they are respectively connected to a terminal 51 mentioned below and a lead wire 40c. The lead wire 40c extends from the relay 40 to the insulation board 15a. The lead wire 40c extends long and in parallel to the insulation board 15a therebetween. The extension exposes the lead wire 40c on the insulation board 15a. The exposed front end portion is bent to the insulation board 15a and is fixed to the circuit pattern 46 by a solder 47a. The exposed lead wire 40c is provided with a heat radiating function.

Figure 9:
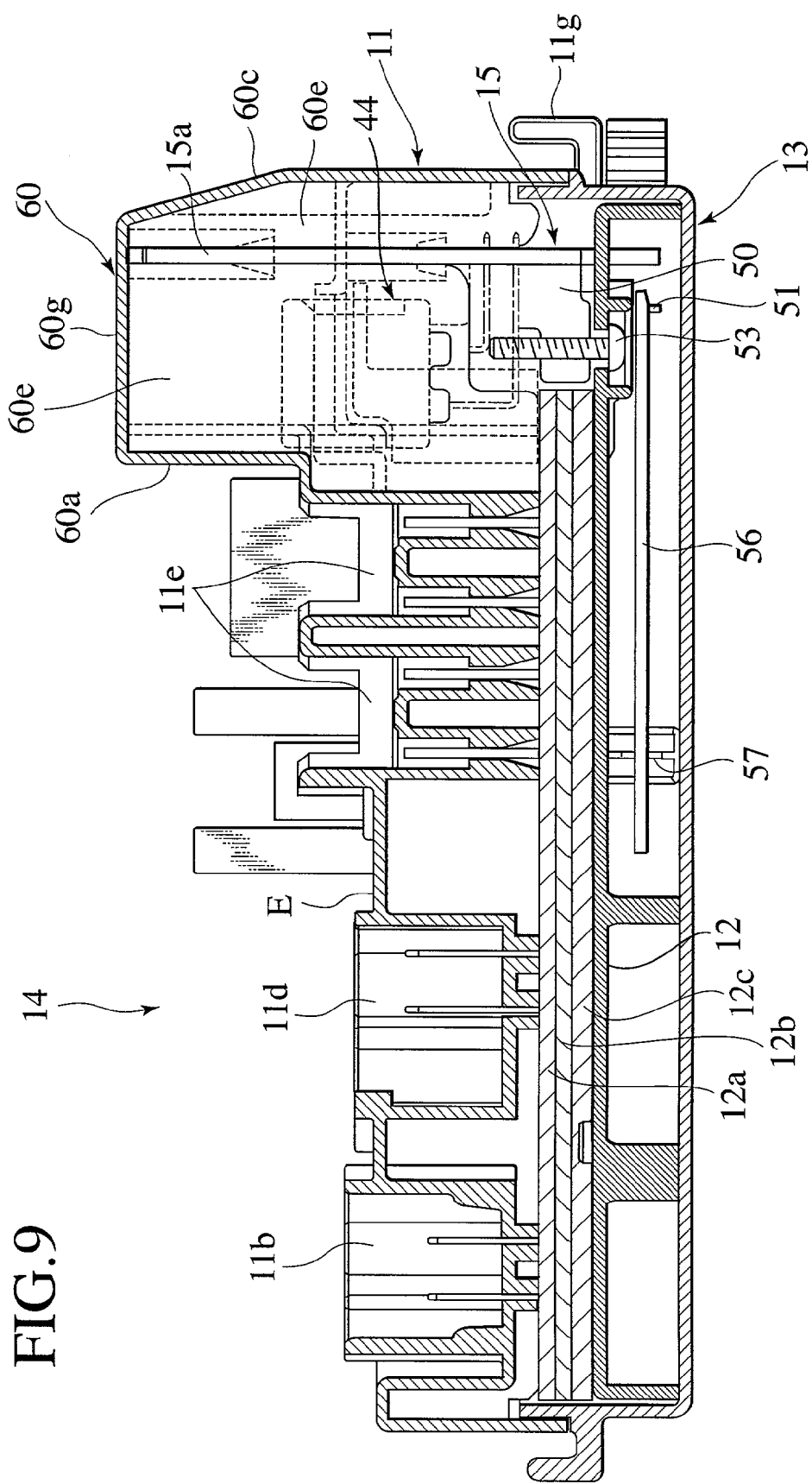
FIG. 9 is a sectional view taken along a line IX-IX in FIG. 3.

The terminal block 50 is separated into two pieces in a substantially center portion in a longitudinal direction thereof, so as to constitute a first separation block 50b and a second separation block 50c. End portions in the first and second separation blocks 50b and 50c which are adjacent to each other are stacked with each other as shown in FIG. 4, so as to constitute a stacked part 52. The both end portions and the stacked part 52 are fastened to the board 12 by a screw 53 corresponding to a fastening member, as shown in FIG. 9, thereby fixing the terminal block 50. The screw 53 is inserted from the back surface of the board 12. The stacked part 52 is fastened by one screw 53 as shown in FIG. 5.

The first separation block 50b has a vertical inner surface 50d, and the relay holding board 45 is provided therein in parallel to the insulation board 15a, as shown in FIG. 5. The holding board 45 has a window portion 45a in correspondence to the arrangement of the relay 40. By fitting the relay 40 to the window portion 45a so as to retain, it is possible to stably retain the relay 40 which is apart from the insulation board 15a.

The end of the terminal 51 protrudes from the vertical outer surface 50a of the terminal block 50. Another end thereof has a conduct wire part 54 protruding out from the upper side of the terminal block 50. The conduct wire part 54 is perpendicularly bent toward the insulation board 14a of the control base board 15 so as to pass through the insulation board 15a. As shown in FIG. 10, the through portion is fixed to the circuit pattern 46 of the control base board 15 by a solder 47.

Further, the terminal 51 is connected to the relay 40 mentioned above, and as shown in FIG. 8, another end thereof passes through the holding portion 45 so as to protrude within the window portion 45a.

The terminal 51 is inserted from an insertion opening 55 of the board 12, as shown in FIG. 1. The terminal 51 is press contacted to a terminal of the electric wire 56 so as to be connected, as shown in FIG. 5.

At this time, the outer surface 50a of the terminal block 50 contacts with the upper surface of the board 12. In this state, the outer surface 50a is fastened and fixed by the screw 53. In a state of fixing the terminal block 50 to the board 12, the terminal block 50 is substantially perpendicular to the insulation board 15a. Accordingly, the base board 15 is perpendicularly mounted to the board 12.

The upper cover 11 has the mounting face E, as shown in FIGS. 1 and 2, and the control base board 15 is arranged in a half side (a far side part in FIGS. 1 and 2) thereof. This one half side forms the insertion openings 11b, 11c and 11d, various kinds of relays 20, 21 and 22, and a bulge 60. The relays 20, 21 and 22 are outward mounted to the insertion opening 11e. In the bulge 60, a protruding amount h becomes larger than that of the fuse 23. As shown in FIG. 9, the bulge 60 receives the control base board 15 in an inner side thereof.

The bulge 60 has a heat insulation wall 60a as shown in FIG. 9. The wall 60a insulates thermally the base board 15 from the respective insertion openings 11b, 11c and 11d of the upper cover 11. The bulge 60 has a top wall 60b continuously provided from the wall 60a. The bulge 60 has a rear wall 60c covering a back side of the control base board 15. The walls 60a, 60b and 60c are formed so as to have a C-shaped cross section. As shown in FIG. 2, the bulge 60 has both ends, and they are closed by side walls 60d.

Further, the control base board 15 has the power portion P and the control portion C, as shown in FIG. 5, and they are separately arranged. The bulge 60 has a heat insulation partition 60e in an inner side thereof as shown in FIG. 9, and this is inserted between the power portion P and the control portion C. The partition 60e insulates the power portion P and the control portion C. The partition 60e is shown by a two-dotted chain line in FIG. 5.

Accordingly, in a state of receiving the base board 15 between the upper cover 11 and the under cover 13, the bulge 60 covers an outer side of the base board 15. The partition 60e is inserted into a boundary between the portion having a great amount of generation heat and the portion having a small amount of generation heat in the base board 15.

Figure 12:
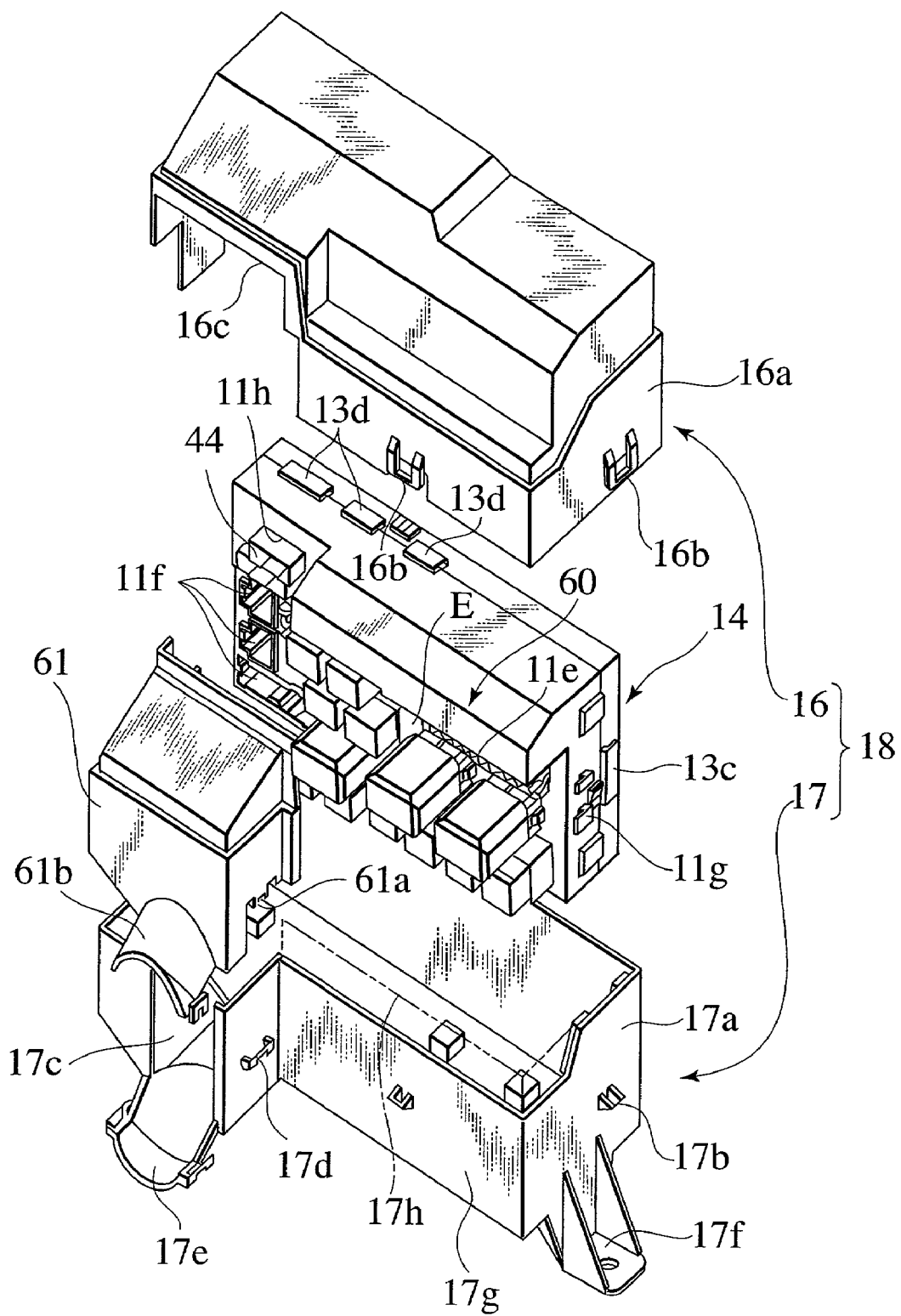
FIG. 12 is a perspective view in which the module and a case in an electric connection box have been separated.

The case 18 has the upper case 16 and the lower case 17 constituting a pair, as shown in FIG. 12. A side wall 16a of the upper case 16 is mated to an outer peripheral surface of a side wall 17a of the lower case 17. A lock hook 16b of the upper case 16 is removably engaged with an engagement projection 17b of the lower case 17.

The upper case 16 and the lower case 17 define openings 16c and 17c respectively notched at positions corresponding to the connector insertion openings 11f and the base board connector 44. These openings 16c and 17c form one opening portion 18a at a time of mating the upper case 16 and the lower case 17 with each other.

The openings 16c and 17c have a closing member 61 therebetween, and this is independent from the upper case 16 and the lower case 17. The closing member 61 closes a portion between the openings 16c and 17c at a time of mating the upper case 16 to the lower case 17. The closing member 61 has a lock hook 61a, and this is fixed removably to an engagement projection 17d of the lower case 17.

At this time, an upward-directed semi-cylinder portion 17e is formed in a lower part of the opening portion 17c. A downward-directed semi-cylinder portion 61b is formed in a lower part of the closing member 61. The semi-cylinder portions 17e and 61b are combined so as to form a cylindrical shape. The cylinder portion passes wire harnesses of the mating connectors (not shown) connected to the connector 11f and the base board connector 44 through in a lump. A mounting leg 17f is perpendicularly provided in the lower case 17.

At a time of receiving the module 14 in the case 18, the module 14 is at first received in the lower case 17 and the bulge 60 is arranged in the above, as shown in FIG. 12. The upper case 16 is mated to the outer peripheral surface of the lower case 17 from the above. According to this mating, the hook 16b and the projection 17b are engaged. The mating connector is connected to the connector 11f and the connector 44 in the module 14 from the opening 18a. The wire harness is arranged between both of the semi-cylinder portions 61b and 17e. The closing member 61 is arranged in the opening portion 18a. The hook 61a is engaged with the projection 17d.

At a time of inserting the module 14 into the case 18 from the above so as to receive therein, the first pressing lock pieces 11g and 13c of both of the side walls 11a2 and 13a2 in a Y direction (refer to FIG. 2) are engaged with engagement portions (not shown) in an inner side of the lower case 17. Front end surfaces of the first lock pieces 11g and 13c resiliently abut against the inner side of the lower case 17. This abutment prevents the module 14 from loosening within the case 18.

Further, when case 18 receives module 14, the mounting face E of the upper cover 11 is arranged in a front surface 17g of the lower case 17. At this time, the insertion opening 11e of the mounting face E is positioned at a right half portion (shown by a two-dotted chain line in the drawing) of an upper end portion in the front surface 17g of the lower case 17. According to the present embodiment, the right half portion of the upper end portion is previously cut, and an opening 17h to which the insertion opening 11e is exposed is formed.

Next, a description will be given of an operation.

In the connection box 10 mentioned above, the base board 15 corresponding to the control portion is mounted to the board 12. The module 14 is structured by receiving the board 12 between the upper cover 11 and the under cover 13. The connection box 10 is structured by receiving the module 14 within the case 18 constituted by the upper case 16 and the lower case 17. The lower case 17 of the connection box 10 is mounted within an engine room of a vehicle (not shown) via the mounting leg 17f. The connection box 10 is collectively connected to the wire harnesses (not shown) of the various kinds of electrical equipment provided in the vehicle.

In this connection box 10, the relay 40 to be provided in the base board 15 is mounted by a predetermined spacing δ apart from the surface of the insulation board 15a, as shown in FIG. 8. The relay 40 and the insulation board 15a have an air layer corresponding to the spacing δ between. The air layer forms a heat insulation layer so as to insulate the heat produced by the relay 40. This insulation reduces the heating of the insulation board 15a. This results in restricting a heat influence applied to the other electronic parts mounted to the insulation board 15a, in particular, the device 43 constituting the control circuit, in the connection box 10.

According to the reduction of the heat influence applied to the device 43, it is possible to prevent the device 43 from being broken and it is possible to prevent the false function from occurrence. Due to this prevention, it is possible to execute a stable and aimed control and it is possible to increase a reliability of the connection box 10. It is possible to secure a stability of the relay 40 by mounting the relay 40 to the inner surface 50d of the terminal block 50. In the case of mounting the relay 40 to the terminal block 50, it is also possible to prevent the heat generation of the relay 40 from being directly conducted to the insulation board 15a of the base board 15.

Since the long lead wire 40c exposes from the relay 40, a part of the heat to be produced in the relay 40 is conducted to the lead wire 40c. It is possible to effectively cool the relay 40 itself by radiating the heat by the exposure portion.

Accordingly, according to the heat radiation in the lead wire 40c, it is possible to reduce the generation heat contained in the relay 40 and the heat conducted from the relay 40 to the insulation board 15a. This reduction further reduces the heat influence on the other electronic parts.

The entire contents of Japanese Patent Applications P2001-133531 (filed on Apr. 27, 2001) are incorporated herein by reference.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A connection box comprising:
    a wiring board mounted in a first plane;
    a plurality of circuit boards mounted upon the wiring board;
    a control board mounted to a portion of the wiring board, the control board being mounted in a plane perpendicular to the first plane, wherein the control board includes an insulation board having a first portion with plurality of electronic devices mounted thereon and a second portion having a control device mounted thereon, the second portion being spaced from the first portion, and wherein at least one of the plurality of electronic devices includes a heat-producing radiative device that is spaced away from the insulation board; and
    a wire extending from the radiative device to the insulation board,
    wherein the wire is spaced away from and extends parallel to the insulation board.

2. The connection box according to claim 1, wherein the heat-producing radiative device includes a relay.

3. The connection box according to claim 1, wherein at least one of the plurality of electronic devices includes one of a relay, a resistor, and a coil.

4. The connection box according to claim 1, wherein the control device includes a microprocessor.

5. The connection box according to claim 1, wherein the first portion of the insulating board produces a first amount of heat and the second portion of the insulating board produces a second amount of heat different from the first amount of heat.

6. The connection box according to claim 5, wherein the first amount of heat is greater than the second amount of heat.

7. The connection box according to claim 6, wherein the connection box further includes an upper cover and a lower cover, the wiring board, plurality of circuit boards, and control board being mounted between the upper and lower covers.

8. The connection box according to claim 7, wherein the upper cover defines a bulge for receiving the control board.

9. The connection box according to claim 8, wherein the bulge includes a plurality of insulating walls.

10. The connection box according to claim 9, wherein the plurality of insulating walls includes a top wall, a front wall, a rear wall, and two side walls.

11. The connection box according to claim 10, wherein the bulge further includes an insulation partition disposed on an inner surface of one of the plurality of insulating walls.

12. The connection box according to claim 11, wherein the insulation partition insulates the first portion of the insulation board from the second portion of the insulation board.

13. The connection box of claim 7, wherein the upper cover includes a mounting face having a plurality of openings thereon, at least one of the openings receiving a connector disposed on the control board.

14. The connection box according to claim 1, wherein the control board further includes at least one connector.

15. The connection box of claim 1, wherein the wiring board includes a plurality of wiring holes.

* * * * *

UNITED STATES PATENT AND TRADEMARK OFFICE
CERTIFICATE OF CORRECTION

| | |
|---|---|
| PATENT NO. | : 7,351,911 B2 |
| APPLICATION NO. | : 10/132264 |
| DATED | : April 1, 2008 |
| INVENTOR(S) | : Akihiko Chiriku et al. |

It is certified that error appears in the above-identified patent and that said Letters Patent is hereby corrected as shown below:

On the title page, item (57), line 1, "An connection" should read --A connection--.

Signed and Sealed this

Nineteenth Day of August, 2008

JON W. DUDAS
*Director of the United States Patent and Trademark Office*